US012306280B2

(12) United States Patent
Zhong et al.

(10) Patent No.: US 12,306,280 B2
(45) Date of Patent: May 20, 2025

(54) MAGNETIC RESONANCE IMAGING USING 3D SPOILED GRADIENT-RECALLED SEQUENCE

(71) Applicant: The Board of Trustees of the Leland Stanford Junior University, Stanford, CA (US)

(72) Inventors: Zheng Zhong, Houston, TX (US); Christopher Michael Sandino, Menlo Park, CA (US); Shreyas S. Vasanawala, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 136 days.

(21) Appl. No.: 18/113,805

(22) Filed: Feb. 24, 2023

(65) Prior Publication Data
US 2023/0266417 A1    Aug. 24, 2023

Related U.S. Application Data

(60) Provisional application No. 63/313,480, filed on Feb. 24, 2022.

(51) Int. Cl.
  *G01R 33/561* (2006.01)
  *G01R 33/54* (2006.01)
  *G01R 33/56* (2006.01)

(52) U.S. Cl.
  CPC ......... *G01R 33/561* (2013.01); *G01R 33/543* (2013.01); *G01R 33/5608* (2013.01); *G01R 33/5613* (2013.01)

(58) Field of Classification Search
  CPC ............ G01R 33/561; G01R 33/543; G01R 33/5608; G01R 33/5613; G01R 33/4822; G01R 33/4826; G01R 33/565
  See application file for complete search history.

(56) References Cited

U.S. PATENT DOCUMENTS

| 2011/0187369 A1* | 8/2011 | Rivas Davila | G01R 33/3852 324/318 |
| 2013/0271132 A1* | 10/2013 | Griswold | G01R 33/546 324/309 |
| 2018/0306881 A1* | 10/2018 | Tamada | G01R 33/54 |

OTHER PUBLICATIONS

Zucker, Evan J., et al. "Free-breathing pediatric chest MRI: performance of self-navigated golden-angle ordered conical ultrashort echo time acquisition." Journal of Magnetic Resonance Imaging 47.1 (2018): 200-209. (Year: 2018).*
Gurney, et al. Design and analysis of a practical 3D cones trajectory. Magn. Reson. Med. Mar. 2006;55(3):575-82.
(Continued)

*Primary Examiner* — Rishi R Patel
(74) *Attorney, Agent, or Firm* — LUMEN PATENT FIRM

(57) ABSTRACT

A method for magnetic resonance imaging (MRI) performs a spoiled gradient-recalled (SPGR) MRI scan with an MRI scanner to produce MRI data; and reconstructs an MRI image from the MRI data; wherein performing the SPGR MRI scan comprises playing an interleaved-randomized spoiler (IRS) gradient after every M-th acquisition block, where M≥2, and where an absolute area of the IRS gradient of each IRS is randomized between zero and a maximum gradient area achievable on the MRI scanner.

8 Claims, 5 Drawing Sheets

(56) References Cited

OTHER PUBLICATIONS

Chen, B. et al. Three-dimensional ultrashort echo time cones (3D UTE-Cones) magnetic resonance imaging of entheses and tendons. Magn. Reson. Imaging Jun. 2018;49:4-9.
Kee, Y. et al. Free-Breathing R2* Mapping of Hepatic Iron Overload in Children Using 3D Multi-Echo UTE Cones MRI. Magn. Reson. Med. May 2021;85(5):2608-2621.

* cited by examiner

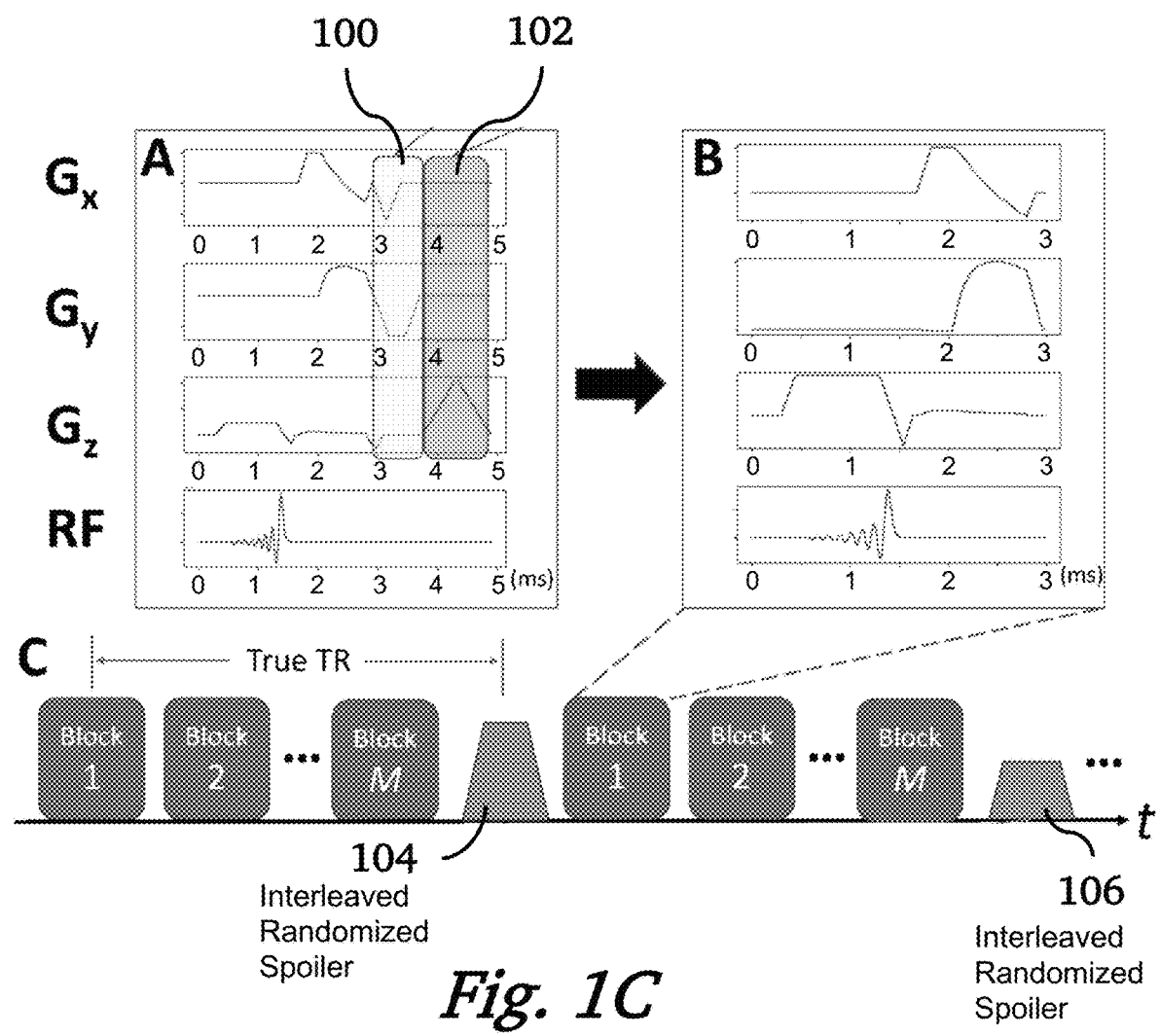

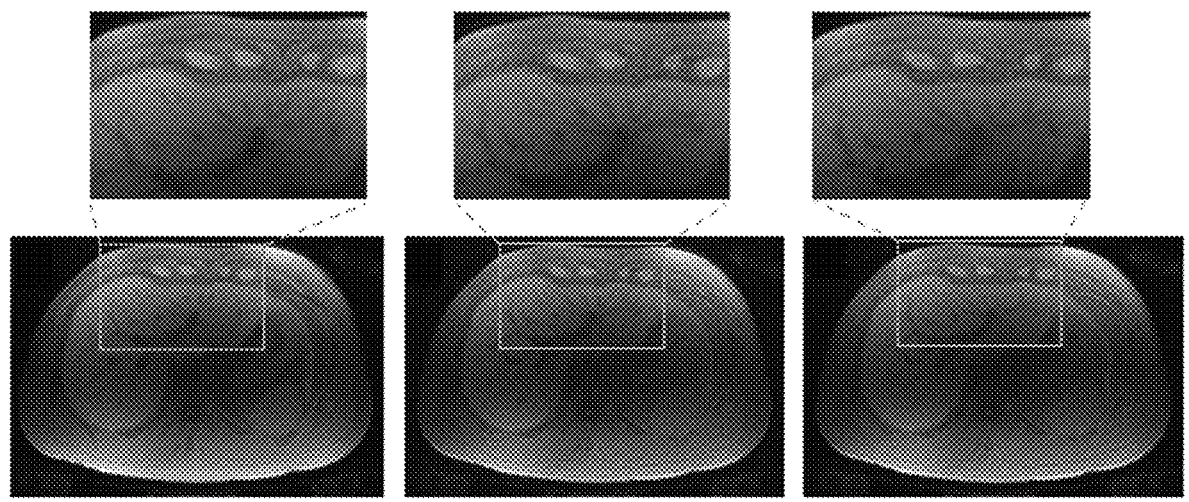
*Fig. 4A*  *Fig. 4B*  *Fig. 4C*

*Fig. 5A*     *Fig. 5B*     *Fig. 5C*
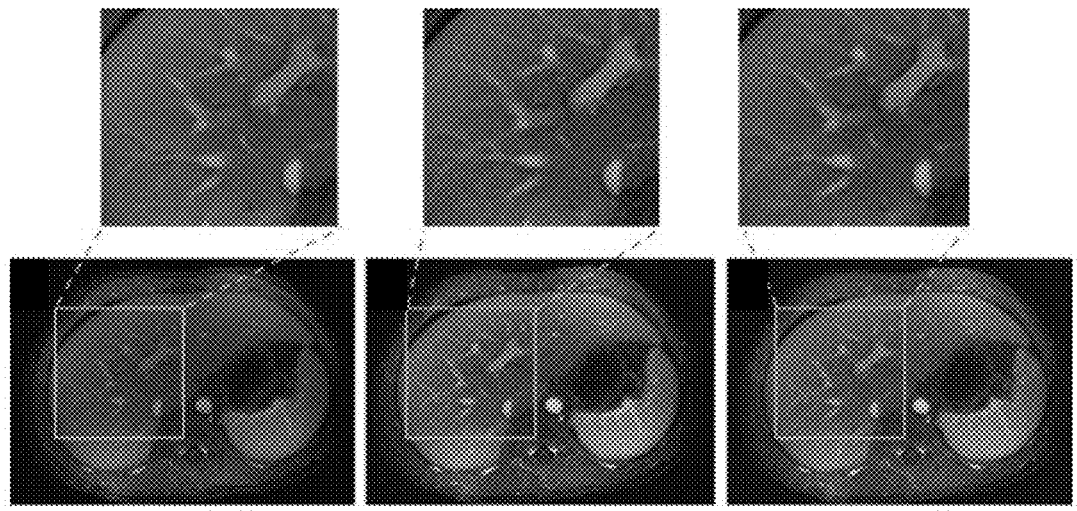
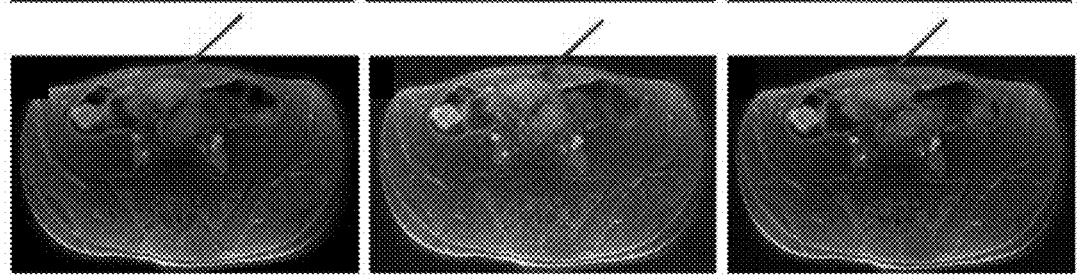
*Fig. 5D*     *Fig. 5E*     *Fig. 5F*

MAGNETIC RESONANCE IMAGING USING 3D SPOILED GRADIENT-RECALLED SEQUENCE

CROSS-REFERENCE TO RELATED APPLICATIONS

This application claims priority from U.S. Provisional Patent Application 63/313,480 filed Feb. 24, 2022, which is incorporated herein by reference.

STATEMENT OF FEDERALLY SPONSORED RESEARCH

This invention was made with Government support under contract EB029427 awarded by the National Institutes of Health, and under contract EB009690 awarded by the National Institutes of Health. The Government has certain rights in the invention.

FIELD OF THE INVENTION

The present invention relates generally to medical imaging. More specifically, it relates to techniques for magnetic resonance imaging (MRI) using 3D spoiled gradient-recalled sequences.

BACKGROUND OF THE INVENTION

A spoiled gradient-recalled (SPGR) sequence is a rapid scanning pulse sequence used in MRI acquisition. Contrast-enhanced SPGR is standard in abdominal imaging, but gradient spoiling itself is time-consuming. This inefficiency can be mitigated with long-readout non-cartesian trajectories, but remains a significant issue. For example, the three-dimensional (3D) cones trajectory has a relatively long readout and exhibits good motion properties, which can be quite useful in abdominal imaging that suffers from extensive motion. Despite the long readout, the spoiling gradient in 3D-cones sequence can still consume up to 40% of the time to repetition (TR). One possible approach to improve the scan efficiency is by removing spoiling gradients. However, that would introduce severe image artifacts arising from unspoiled transverse magnetization.

SUMMARY OF THE INVENTION

Described here is an MRI imaging technique using a scanning approach exploiting interleaved-randomized spoilers (IRS) in the 3D-cones sequence. This reduces image artifacts arising from unspoiled transverse magnetization while maintaining scan time reduction. The SPGR sequence relies on randomized RF phase and spoiling gradient (usually referred to as a spoiler) after the readout gradient to destroy the residual magnetization that can cause severe image artifacts. The method exploits an interleaved, randomized spoiler approach to achieve more efficient SPGR without introducing any image artifacts.

This approach of applying interleaved, randomized spoilers to a motion-robust 3D-cones sequence can shorten acquisition time without introducing image artifacts, as was validated by the inventors on both healthy subjects and patients.

This method can be used for any magnetic resonance scanner to improve the efficiency of SPGR sequence, whether it uses Cartesian, or non-Cartesian trajectories. Accelerated acquisition with 20% time-saving can be achieved with similar image quality.

In one aspect, the invention provides a method for magnetic resonance imaging (MRI) comprising: performing a spoiled gradient-recalled (SPGR) MRI scan with an MRI scanner to produce MRI data; and reconstructing an MRI image from the MRI data; wherein performing the SPGR MRI scan comprises playing an interleaved-randomized spoiler (IRS) gradient after every M-th acquisition block, where M≥2, and where an absolute area of the IRS gradient of each IRS is randomized between zero and a maximum gradient area achievable on the MRI scanner.

Preferably, a rewinder and a spoiler gradient are not played at the end of each TR. In one embodiment, the interleaved-randomized spoiler (IRS) gradient sequence is a turbo-cones sequence.

The interleaved-randomized spoiler (IRS) gradient sequence may be a cartesian SPGR based sequence, a non-cartesian SPGR based sequence, or a radial SPGR based sequence. Preferably, the absolute area of the IRS gradient of each IRS is randomized between half and full of the maximum gradient area achievable on the MRI scanner. Preferably, performing the SPGR MRI scan comprises using a phyllotaxis trajectory ordering that rotates cones to interleave sequentially and then rotates a large golden angle.

BRIEF DESCRIPTION OF THE DRAWINGS

FIGS. 1A-1C illustrate an interleaved-randomized spoiler (IRS) technique. FIG. 1A shows conventional 3D-cones sequence. FIG. 1B shows turbo-cones which have the rewinder and spoiler gradients removed. FIG. 1C shows an interleaved-randomized spoiler (IRS) turbo-cones sequence in which the spoiler gradient amplitude is randomized and played every M acquisition blocks, according to an embodiment of the invention.

FIG. 2A shows how a set of cones interleaves rotates sequentially. FIG. 2B shows how it rotates a large golden angle (137.5 degree) for the next set of readout lines. FIG. 2C shows a final k-space trajectory uniformly sampled.

FIGS. 4A-4C are liver images acquired from a healthy subject using the default cones (FIG. 4A), turbo-cones (FIG. 4B) and interleaved randomized spoiler (IRS) turbo-cones (FIG. 4C), respectively.

FIGS. 5A-5F are contrast-enhanced images from the liver and bowel using the default cones (FIG. 5A, FIG. 5D), turbo-cones (FIG. 5B, FIG. 5E) and interleaved randomized spoiler (IRS) turbo-cones (FIG. 5C, FIG. 5F) from two patients, respectively.

DETAILED DESCRIPTION OF THE INVENTION

Figure 2A:
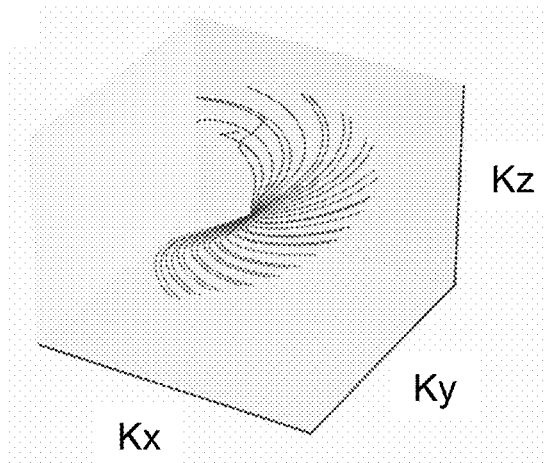
FIGS. 2A-2C are graphs illustrating phyllotaxis ordering of the k-space trajectory used in an example study.

Described herein is an MRI imaging technique exploiting interleaved-randomized spoilers (IRS) in the 3D-cones sequence. The SPGR sequence relies on randomized RF phase and spoiling gradient (i.e., spoiler) after the readout gradient to destroy the residual magnetization that can cause severe image artifacts. This technique allows more efficient SPGR (i.e., shorten acquisition time) without introducing any image artifacts.

The technique is implemented as part of a method for magnetic resonance imaging (MRI) using an MRI scanner. A spoiled gradient-recalled (SPGR) MRI acquisition is performed to produce MRI data, and an MRI image is reconstructed from the is acquired MRI data. The SPGR MRI scan comprises playing an interleaved-randomized spoiler (IRS) gradient after every M-th acquisition block, where M≥2, and where an absolute area of the IRS gradient of each IRS is randomized between zero and maximum gradient area available.

In a preferred embodiment, the technique is implemented using IRS turbo-cones. Although IRS turbo-cones are illustrated here as an example trajectory, it is noted that the technique may be used with any SPGR-based sequence, including radial, spiral, and conventional Cartesian.

As shown in FIG. 1A, in a conventional 3D-cones sequence, a rewinder 100 and spoiler gradient 102 is played at the end of each TR to avoid image artifact arising from the unspoiled transverse magnetization signal.

As shown in FIG. 1B, removing the rewinder and spoiler gradients in the conventional 3D-cones sequences (FIG. 1A) can substantially increase the scan speed (i.e., reduce acquisition time), but at the cost of severe artifacts.

Herein is described a technique to overcome this problem with the sequences shown in FIG. 1A and FIG. 1B. As shown in FIG. 1C, to effectively destroy the residual transverse magnetization, an interleaved-randomized spoiler (IRS) is implemented. In the IRS turbo-cones sequence shown in FIG. 1C, the spoiler gradient amplitude 104, 106 is randomized and played every M acquisition blocks (where M is an integer equal to at least 2). In doing so, only N/M spoilers are required, assuming N acquisition blocks are needed to achieve full sampling, which can effectively avoid image artifacts while substantially shortening the scan times.

The larger the area of the spoiler gradient is, the better effect it can achieve to destroy the residual transverse magnetization. But practically, it cannot be too large, because it increases the scan time. In one implementation, the area (i.e., integral of magnitude over time) of the gradient of each IRS 104, 106 is randomized between zero and the maximum gradient area available, or more preferably between half the maximum and the maximum of the largest gradient available. More generally, it is randomized between zero and the gradient area required to perform adequate spoiling (Asp), or more preferably between Asp/2 and Asp.

The phase dispersion (Δφ) across a voxel is:

$$\Delta\varphi = \gamma A_{sp}\Delta r$$

Where $\gamma$ is the gyromagnetic ratio, and $A_{sp}$ is the spoiler gradient area, and $\Delta r$ is the voxel dimension along the spoiling gradient direction. The minimal phase dispersion required to spoil the unwanted transverse magnetization is typically determined by experiments. For most applications, the minimal phase dispersion must be greater than $2\pi$ across an image voxel. Also, please note that the required spoiler gradient area Asp is inversely related to the voxel size.

The randomized spoiler can prevent the residual transverse magnetization from reaching a steady state, which cannot form a conceivable signal in the image. Therefore, the image artifact can be effectively reduced while shortening the acquisition time. The optimal series of spoiler gradients may be found by using Bloch simulations to make it more applicable in-clinic use.

Phyllotaxis K-space Trajectory Ordering

The feasibility of using the IRS turbo-cones pulse sequence in MRI acquisition was validated on patients. Contrast-enhanced liver and bowel images acquired using IRS turbo-cones were very close to the images acquired using default cones but with 17.3% reduced acquisition time, without any image artifacts. The feasibility of the method was validated on water phantom (in vitro), healthy subjects, and patients.

Figure 2B:
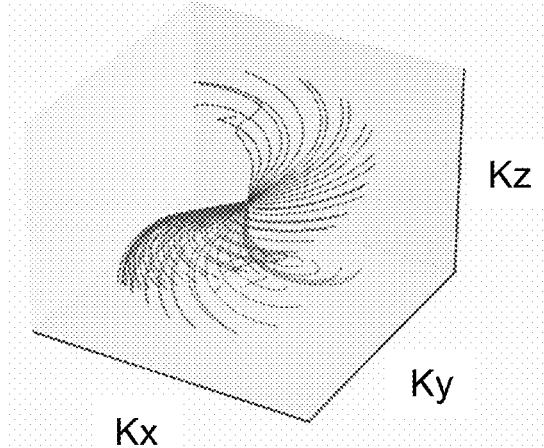
Figure 2C:
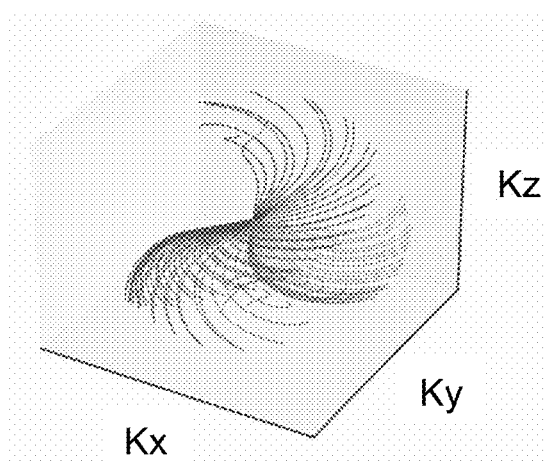

In addition to the IRS mechanism, embodiments of the invention may use a phyllotaxis k-space trajectory ordering in analogy to the arrangement of leaves on a stem, as illustrated in FIGS. 2A-2C. Conventional 3D-cones sequence uses a golden angle k-space trajectory ordering, where the cones interleave rotates ~222.5° each time to achieve a uniformly sampled k-space. In contrast, according to embodiments of the present invention, a phyllotaxis trajectory ordering rotates the cones to interleave sequentially for a few lines and then rotates a large golden angle (~137.5°) for the next set of readout lines. In doing so, the final k-space trajectory will also uniformly sample the k-space as in the golden angle ordering. Additionally, because the readout gradient itself can partially serve as the spoiling gradient, the readout gradients in the set of sequentially rotated cones interleaves together can achieve better spoiling effect than in a set of large golden angle rotations.

For example, a set of cones interleaves rotates sequentially (FIG. 2A), then rotates a large golden angle (~137.5°) for the next set of readout lines (FIG. 2B), similar to the arrangement of leaves on a stem. The final k-space trajectory (FIG. 2C) is uniformly sampled, as in the golden angle ordering, but can more effectively destroy the residual transverse magnetization.

Data Acquisition and Analysis

In one example implementation, the IRS turbo-cones sequence (FIGS. 1A-1C) acquisition was performed by a 3T GE MR750/Premier scanner (GE Healthcare, Waukesha, Wisconsin). The feasibility of the sequence was first validated on a water phantom. Then free-breathing abdominal images were acquired using IRS turbo-cones from six healthy human subjects and four patients (4y to 34y, mean age: 19.9±12.7 years old). Images were also acquired using default 3D-cones and turbo-cones as a comparison. In patients, post-contrast images were acquired after administration of ferumoxytol as intravenous contrast, which remains in the blood pool for many hours, and thus enables comparison between successively run sequences.

The key sequence parameters for both phantom imaging and in-vivo imaging were as follows: slice thickness was 3 mm, FOV was 36 cm×36 cm×18 cm, matrix was 320×320×120, flip angel was 15°, TE was 0.6 ms, TR was 5 ms, 2.7 ms and 2.7 ms, and acquisition time was 2:20, 1:34 and 1:52 for default 3D-cones, turbo-cones, and IRS turbo-cones, respectively. After acquiring the k-space data, images were reconstructed offline using a custom Python program based on the gridding algorithm (non-uniform FFT) provided in BART. Any basic NUFFT or advanced reconstruction methods can be used to reconstruct an image from the acquired k-space data.

Results

Figures 3A, 3B, 3C:
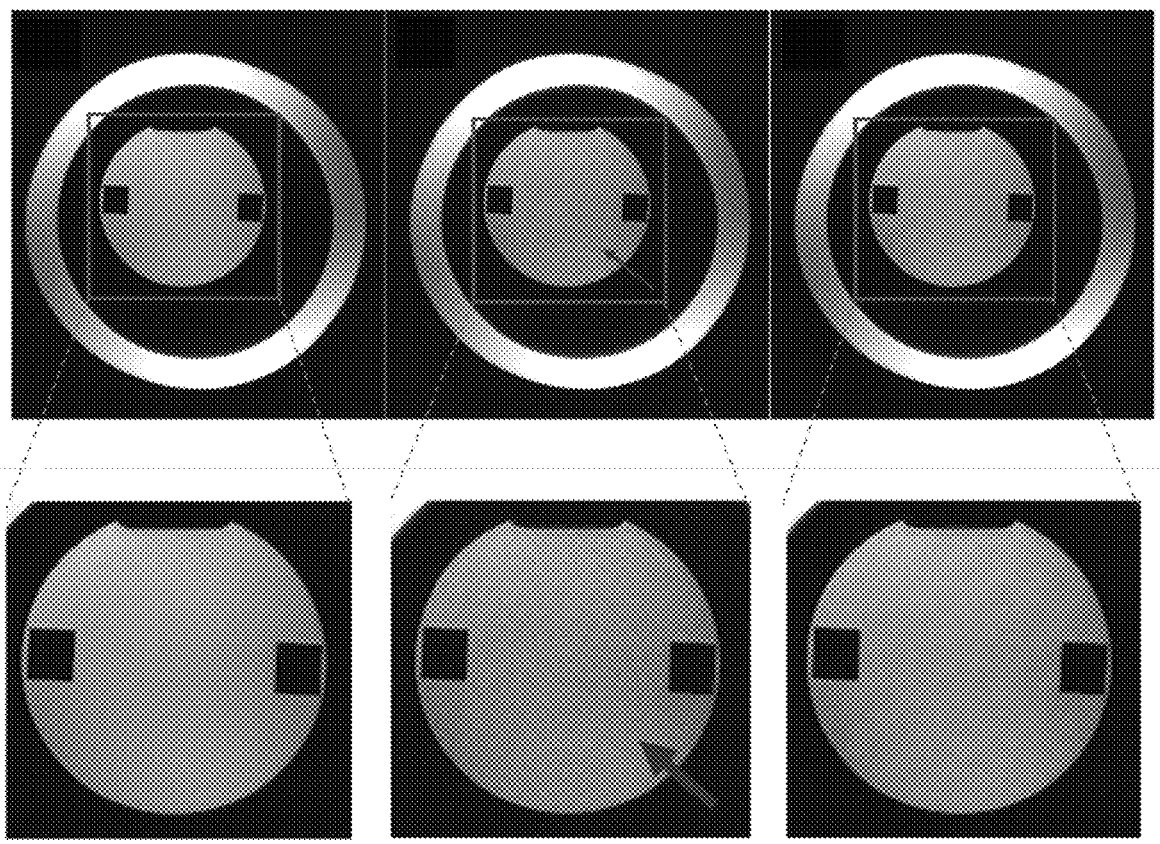
FIGS. 3A-3C are phantom images acquired using the default cones (FIG. 3A), turbo-cones (FIG. 3B) and inter-leaved randomized spoiler (IRS) turbo-cones (FIG. 3C), respectively.

As shown in FIGS. 3A-3C, phantom images acquired using turbo-cones sequence without any spoiler gradient exhibit severe artifacts, whereas the images acquired using IRS turbo-cones were free from artifacts. Specifically, the figures show phantom images acquired using the default cones (FIG. 3A), turbo-cones (FIG. 3B) and interleaved randomized spoiler (IRS) turbo-cones (FIG. 3C), respectively. The residual transversal magnetization can be effectively destroyed using IRS as demonstrated on the phantom images.

A similar result was observed in T1-weighted liver images of healthy subjects, where IRS turbo-cones showed similar image quality as default 3D cones sequence despite a shorter acquisition time of about 20% (FIGS. 4A-4C). The feasibility of IRS turbo-cones was further validated on patients (FIGS. 5A-5F). Again, the contrast-enhanced liver and bowel images acquired using IRS turbo-cones were very close to the images acquired using default cones but with 17.3% reduced acquisition time.

FIGS. 4A-4C show liver images acquired from a healthy subject using the default cones (FIG. 4A), turbo-cones (FIG. 4B) and interleaved randomized spoiler (IRS) turbo-cones (FIG. 4C), respectively. The IRS turbo-cones provides similar image quality compared with the fully spoiled 3D cones sequence, despite a 20% reduction of the acquisition time. The image from unspoiled turbo-cones is corrupted by artifact.

FIGS. 5A-5F show contrast-enhanced images from the liver and bowel using the default cones (FIG. 5A, FIG. 5D), turbo-cones (FIG. 5B, FIG. 5E) and interleaved randomized spoiler (IRS) turbo-cones (FIG. 5C, FIG. 5F) from two patients (5 yo, female and 19 yo, male), respectively. The acquisition time was 2:20, 1:34 and 1:52 for default cones, turbo-cones, and IRS turbo-cones, respectively. Compared with default cones, IRS turbo-cones reduces scan time by 17% with similar image quality, whereas the unspoiled turbo-cones can save 30% scan time, but with severe image artifacts. The red arrow indicates an area of bowel inflammation.

Discussion and Conclusion

Application of an interleaved-randomized spoiler to 3D cones results in a 20% scan time reduction with minimal residual artifact in free-breathing abdominal imaging. These results show that interleaved randomized spoiler together with the phyllotaxis ordering is a viable approach that can effectively destroy transverse is magnetization while shortening the TR. The time saved from reduced acquisition time could be translated to higher spatial resolution or faster scans. The same approach can also be extended to other trajectories such as cartesian or radial SPGR based sequences and is not limited to 3D-cones.

The invention claimed is:

1. A method for magnetic resonance imaging (MRI) comprising:
    performing with an MRI scanner a spoiled gradient-recalled (SPGR) MRI scan using an SPGR acquisition sequence to produce MRI data; and
    reconstructing an MRI image from the MRI data;
    wherein performing the SPGR MRI scan comprises playing an interleaved-randomized spoiler (IRS) gradient after every M-th acquisition block of the SPGR acquisition sequence, where M≥2, and where an absolute area of the IRS gradient is randomized between zero and a maximum gradient area achievable on the MRI scanner.

2. The method of claim 1 wherein a rewinder and a spoiler gradient are not played at the end of each repetition time (TR).

3. The method of claim 1 wherein the SPGR acquisition sequence is a turbo-cones sequence.

4. The method of claim 1 wherein the SPGR acquisition sequence is a cartesian SPGR based sequence.

5. The method of claim 1 wherein the SPGR acquisition sequence is a non-cartesian SPGR based sequence.

6. The method of claim 1 wherein the SPGR acquisition sequence is a radial SPGR based sequence.

7. The method of claim 1 wherein the absolute area of the IRS gradient of each IRS is randomized between half and full of the maximum gradient area achievable on the MRI scanner.

8. The method of claim 1 wherein performing the SPGR MRI scan comprises using a phyllotaxis trajectory ordering that rotates cones to interleave sequentially and then rotates an angle of 137.5 degrees.

* * * * *